(12) United States Patent
Amelung et al.

(10) Patent No.: US 8,264,142 B2
(45) Date of Patent: Sep. 11, 2012

(54) ILLUMINATION APPARATUS AND METHOD OF PRODUCING A PLANAR LIGHT OUTPUT

(75) Inventors: Joerg Amelung, Dresden (DE); Joachim Wagner, Freiburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 294 days.

(21) Appl. No.: 12/417,401

(22) Filed: Apr. 2, 2009

(65) Prior Publication Data

US 2009/0262545 A1  Oct. 22, 2009

(30) Foreign Application Priority Data

Apr. 21, 2008  (DE) .................. 10 2008 019 926

(51) Int. Cl.
*H01L 27/32* (2006.01)
*H05B 33/02* (2006.01)
*H01J 1/62* (2006.01)

(52) U.S. Cl. ........ 313/506; 313/493; 313/501; 313/512; 257/79

(58) Field of Classification Search .................. 313/506, 313/493, 501
See application file for complete search history.

(56) References Cited

U.S. PATENT DOCUMENTS

| | | | |
|---|---|---|---|
| 5,583,350 A * | 12/1996 | Norman et al. | 257/88 |
| 6,357,904 B1 * | 3/2002 | Kawashima | 362/555 |
| 7,441,931 B2 | 10/2008 | Bayersdorfer et al. | |
| 2004/0188671 A1 | 9/2004 | Tan | |
| 2006/0289857 A1 * | 12/2006 | Kuo | 257/40 |
| 2008/0094004 A1 * | 4/2008 | Ackermann | 315/294 |
| 2008/0225509 A1 * | 9/2008 | Greiner | 362/84 |

FOREIGN PATENT DOCUMENTS

| | | |
|---|---|---|
| EP | 1533632 | 11/2004 |
| JP | H05-225810 A | 9/1993 |
| JP | H10-064678 A | 3/1998 |
| JP | H10-125463 A | 5/1998 |
| JP | 2001-312914 A | 11/2001 |
| JP | 2002-133915 A | 5/2002 |
| JP | 2002-205500 A | 7/2002 |
| JP | 2005-050654 A | 2/2005 |
| JP | 2005-353526 A | 12/2005 |
| JP | 2007-087724 A | 4/2007 |
| JP | 2008-509535 A | 3/2008 |
| JP | 2008-091855 A | 4/2008 |
| JP | 2009-503599 A | 1/2009 |
| JP | 2009-514157 A | 4/2009 |
| JP | 2009-252572 A | 10/2009 |
| JP | 2009-543314 A | 12/2009 |
| WO | WO2006/018067 A1 | 2/2006 |
| WO | WO 2006/027730 | 3/2006 |
| WO | WO2007/015192 A2 | 2/2007 |
| WO | WO2007/049213 A2 | 5/2007 |
| WO | WO2008/007297 A2 | 1/2008 |
| WO | WO 2009/012624 | 1/2009 |

* cited by examiner

*Primary Examiner* — Sikha Roy
(74) *Attorney, Agent, or Firm* — Michael A. Glenn; Glenn Patent Group (57) ABSTRACT

There is described an illumination apparatus with an organic light-emitting device with a first light exit face and an organic light-emitting device with a second light exit face larger than the first light exit face. The inorganic light-emitting device and the organic light-emitting device are arranged so that a planar light output in which light of the inorganic light-emitting device and light of the organic light-emitting device superimpose each other results.

15 Claims, 8 Drawing Sheets

ILLUMINATION APPARATUS AND METHOD OF PRODUCING A PLANAR LIGHT OUTPUT

CROSS-REFERENCE TO RELATED APPLICATIONS

This application claims priority from German Patent Application No. 10 2008 019 926.5, which was filed on Apr. 21, 2008, and is incorporated herein in its entirety by reference.

BACKGROUND OF THE INVENTION

The present invention relates to an illumination apparatus and/or the production of a planar light output.

The illuminants (lamps) dominant in today's general illumination technology are incandescent lamps and fluorescent tubes, first realized about 120 and 60 years ago, respectively. Their technologies of manufacture and their functionalities largely are fully developed. In the past decade, substantial improvements were no longer achieved.

During the last decade, LEDs, i.e. light-emitting diodes (LED=light-emitting diode), made of semiconductors have reached a state of development by far exceeding their original functionalities and fields of employment (indicator, status and signal lamps, display technology). Today, LEDs have already started penetrating display technology for outside as well as special fields of illumination and background lighting.

Gradual penetration of the sector of general illumination by LEDs still necessitates very significant advances in the reduction of LED manufacturing costs and consumer retail prices. If the latter is achieved to a sufficient extent, the vision of "solid state lighting" may become the illumination technology of the 21$^{st}$ century.

The driving forces in this development are the advantages and the benefits LEDs offer as compared with conventional light sources. The prominent advantages of semiconductor-based LEDs are:

Compact construction (dimensions of few mm)
Robustness (no fragile glass components)
Low operating temperatures
Low operating voltages (few volts), mobile device operation (batteries)
Fast modulation capacity, partially e.g. above 100 MHz
Long life of more than 10,000 h, for example
Highest potential power efficiency of all electric illuminants
High point luminance
Environmental compatibility (e.g. no mercury disposal).

Lamps on the basis of organic light-emitting diodes (OLEDs) are still in the development phase, as opposed to LEDs, but now already show significant potential as the illumination sources of the future.

Through the fast increase in efficiency of these light-emitting diodes, which today already outperform the inorganic light-emitting diodes in the case of green diodes, OLEDs open up a future market for planar illumination. As a planar luminaire with moderate luminance as compared with the LED, the OLED is ideally suited for the production of planar diffuse light sources. In the future, the OLED may here also allow for the realization of flexible luminaires due to its thin-layer technology, which permits completely new applications in the illumination of rooms. The advantages of the OLEDs are:

Planar, diffuse light source
Very thin construction (thickness of below one to few mm)
Low operating voltages (few volts), mobile device operation (batteries)
High power efficiency
Environmental compatibility (no mercury disposal)
Realization possible on flexible undersurfaces The possibility of a completely new kind of electric light production being obtainable by semiconductor light emission devices arose due to the III-V semiconductor (SC) technology starting in the early 1960s. In an III-V SC pn-junction, electrons and holes are injected in a spatially narrow limited area where they recombine under the emission of light. The radiation is largely monochromatic, and its wavelength is determined by the band gap of the SC material. Color LEDs are used mainly in electronics or in status indications. White LEDs, which are based on the principle of partial luminescence conversion of the blue primary light of an LED chip to a yellow-emitting illuminant, and/or color-change LEDs (constructed of three color LEDs), are mainly employed for the field of effect illumination and general illumination. The point brightness of the LEDs has increased sharply in the last few years and today reaches several millions of cd/m$^2$, which makes employment in headlight units possible.

An important market of the future here is the background illumination of LCDs. If a planar light source with LEDs is to be realized, there are two methods for realization. On the one hand, directly radiating LEDs with an upstream diffuser are applied for the planar illumination. The disadvantage here is the diffuser, which homogenizes the more effectively, the greater the distance is to the light-emitting diode. This increases the thickness of the realized illumination areas and may also lead to angle dependencies in the color spectrum. Another possibility is the lateral radiation of LEDs with wedge optics or scattering foil optics, by which the laterally radiated light is diverted in the viewing direction. Here, the dimensioning of the scattering foil/wedge optics is complicated in order to avoid inhomogeneities in the area. Furthermore, the lateral launching achieves less efficiency, because light is absorbed in the diversion.

Electroluminescence from organic materials was first discovered in anthracene single crystals in 1963. Based thereon, the first light-emitting diodes of thin organic layers could be presented by Tang and VanSylke in 1987. In the simplest case, an OLED consists of an organic layer disposed between two electrodes (anode and cathode). As an anode, often ITO (indium tin oxide) coated glass substrates are used, which are sufficiently conductive and transparent in the visible spectral range, so that the produced light may exit through this electrode. In contrast to LEDs, OLEDs have a comparably lower brightness of 100-5000 cd/m$^2$, which makes them suitable for direct-view illumination, but not for point-light applications. Since OLEDs are based on amorphous layers, they do not require any crystalline undersurface and may be deposited on almost any undersurfaces. White OLEDs are obtained through color combinations (red, green, blue) in a layer sequence. Because of the small layer thickness (about 300 nm altogether), realizations are possible on flexible undersurfaces (plastic foil and/or metal foil). One problem is the high sensitivity to oxygen and water. In order to stabilize the OLED, the substrate is glued with a further glass cap and/or coated by means of a thin-layer sequence of inorganic and/or organic layers.

SUMMARY

According to an embodiment, an illumination apparatus may have an inorganic light-emitting device with a first light exit face and an organic light-emitting device with a second light exit face larger than the first light exit face, wherein the inorganic light-emitting device and the organic light-emitting device are arranged so that a planar light output in which light of the inorganic light-emitting device and light of the organic light-emitting device superimpose each other results.

According to another embodiment, a reading lamp may have an illumination apparatus with an inorganic light-emitting device with a first light exit face and an organic light-emitting device with a second light exit face larger than the first light exit face, wherein the inorganic light-emitting device and the organic light-emitting device are arranged so that a planar light output in which light of the inorganic light-emitting device and light of the organic light-emitting device superimpose each other results, wherein the light of the inorganic light-emitting device forms diffuse illumination and the light of the organic light-emitting device targeted reading light.

According to another embodiment, an automobile tail lamp may have an illumination apparatus with an inorganic light-emitting device with a first light exit face and an organic light-emitting device with a second light exit face larger than the first light exit face, wherein the inorganic light-emitting device and the organic light-emitting device are arranged so that a planar light output in which light of the inorganic light-emitting device and light of the organic light-emitting device superimpose each other results, wherein the inorganic light-emitting device functions as a brake light and/or indicator.

According to another embodiment, a method of producing a planar light output may have the steps of generating light by an inorganic light-emitting device with a first light exit face and generating light by an organic light-emitting device with a second light exit face larger than the first light exit face, so that the light of the inorganic light-emitting device and the light of the organic light-emitting device superimpose each other in the resultant planar light output.

It is a finding of the present invention that many different advantages of the individual components, namely the organic light-emitting devices, on the one hand, and the inorganic light-emitting devices, on the other hand, can be combined so that, altogether, an illumination concept with improved characteristics is obtained. The combination of both illumination sources, i.e. inorganic as well as organic light-emitting devices, utilizing the high point luminescence of the inorganic light-emitting devices, such as LEDs, on the one hand, and the planar light areas by means of organic light-emitting devices, such as OLEDs, allows for the realization of novel combined illumination sources in the field of advertising and/or illumination, for example, as will still be explained in the following. Examples of application for such an illumination concept, for example, are reading lamps with point and background illumination, such as cabin illuminations in airplanes, car tail lamps with an integrated brake light and/or indicator, outside electroluminescent displays for buildings with point illumination of the entrance area or planar color-change displays. Many other applications are possible and include all combinations of point and planar light elements, for example.

In embodiments of the present invention, LEDs are used as point luminaires and combined with OLEDs used as planar luminaires. This combination allows for very flat and effective light systems for a multiplicity of applications, wherein the combination of LED, on the one hand, and OLED, on the other hand, offers the chance of optimum combination of the two light technologies corresponding to the respective application and represents the possibility for realizing a highly-efficient and flat light system.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
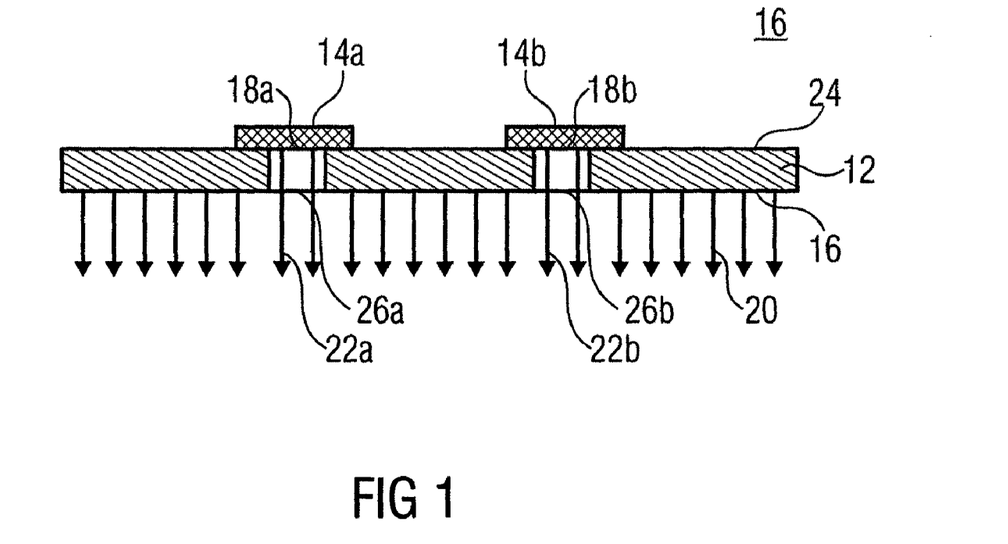
FIG. 1 is a sectional view of an illumination apparatus according to an embodiment.

FIG. 1 shows an illumination apparatus 10 according to an embodiment. The illumination apparatus 10 of FIG. 1 includes an organic light-emitting device 12 as well as one or more inorganic light-emitting devices, with FIG. 1 exemplarily showing two, namely 14a and 14b. The organic light-emitting device 12 comprises a light exit face 16 greater than the light exit faces 18a and 18b of the inorganic light-emitting devices 14a and 14b, respectively. In the embodiment of FIG. 1, the organic light-emitting device 12 and the inorganic light-emitting device(s) comprise(s) a direction of radiation 20, 22a and 22b each, respectively, which are unidirectional or parallel with respect to each other. Here, direction of radiation for example means the direction in which the respective device 12, 14a and 14b radiates with the highest intensity, or the direction in which the respective device 12, 14a and 14b radiates in terms of a centroid or an average. In FIG. 1, the light-emitting devices 14a and 14b are disposed adjacent to a side 24 of the organic light-emitting device 12 facing away from the light exit face 16, so that the light exit faces 16, 18a and 18b are parallel to each other, wherein the organic light-emitting device 12, at the locations at which the inorganic light-emitting devices 14a and/or 14b are arranged, comprises transparent portions, i.e. portions 26a and 26b, respectively, completely transparent in a thickness direction and/or the direction of radiation, which may for example be realized by corresponding openings in one of the electrodes, i.e. anode or cathode, of the organic light-emitting device 12, as will be explained later with reference to FIG. 7. In the areas laterally adjacent to the locations 26a and 26b, the light-emitting device 12 may be impenetrable or opaque for the light of the inorganic light-emitting devices 12a and 12b.

Of course, it is also possible for the devices 14a and 14b to be fixedly connected to the device 12 on the backside 24, such as by means of an adhesive, or the like. However, a fixed arrangement among the device 12 and the devices 14a and/or 14b may also be realized in another way, such as via a frame carrying the devices 12, 14a and 14b.

Although the devices 12, 14a and 14b may also be devices other than diodes, in the following it is exemplarily assumed that they are diodes, i.e. LEDs. However, it is to be pointed out that both for the present embodiment according to FIG. 1 and for the following embodiments, other possible realizations are also conceivable, so that in the following any further reference to the fact that other inorganic, such as semiconductor and/or organic light-emitting devices, could be used instead of the diodes shown there will be omitted.

Figure 2:
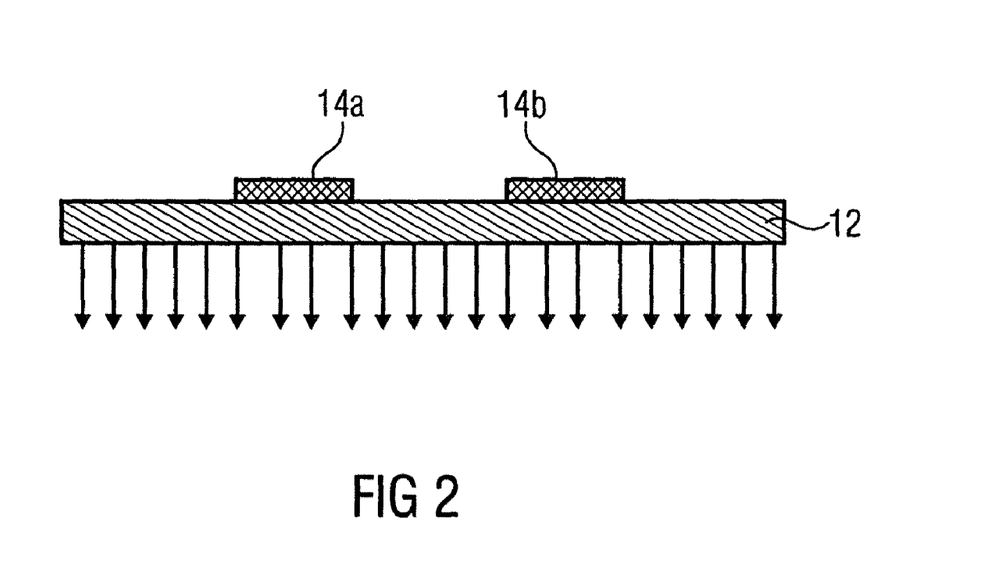
FIG. 2 is a sectional view of an illumination apparatus according to a further embodiment.

While in the embodiment of FIG. 1 the organic device 12, i.e. for example the organic light-emitting diode, was formed as a planar luminaire, which comprises a transparent portion in at least one location, through which an inorganic device, i.e. for example an inorganic LED, which is positioned directly behind the OLED, emits light, FIG. 2 shows an embodiment in which the organic light-emitting diode 12 itself already is formed to be, i.e. laterally totally, transparent and the inorganic LED—there again two, for example, namely 14a and 14b—emit light directly through the OLED 12. Besides, the embodiment in FIG. 2 corresponds to that of FIG. 1.

Figure 3:
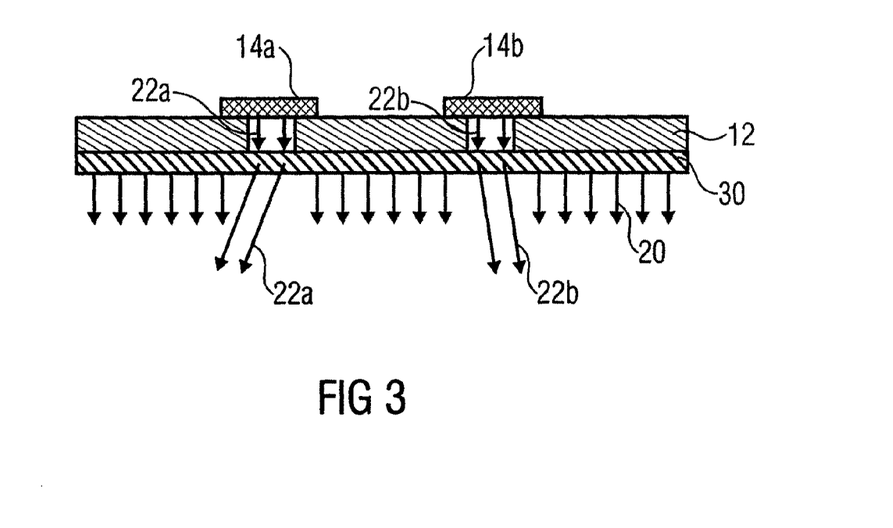
FIG. 3 is a sectional view of an illumination apparatus according to a still further embodiment.

FIG. 3 shows a further possible variation of the embodiment of FIG. 1. In particular, according to the embodiment of FIG. 3, in the direction of radiation 20, 22a and/or 22b behind the organic light-emitting diode 12, such as on the side of the OLED 12 forming the light exit face 16, there is an optical layer 30 having, in lateral direction, i.e. transversal to the direction of radiation 20, 22a and 22b, such a laterally-varying optical characteristic that a solid angle distribution at which the LEDs 14a and/or 14b radiate is influenced more strongly than the solid angle distribution at which the OLED 12 radiates, which is not influenced at all by the layer 30, for example.

Figure 4:
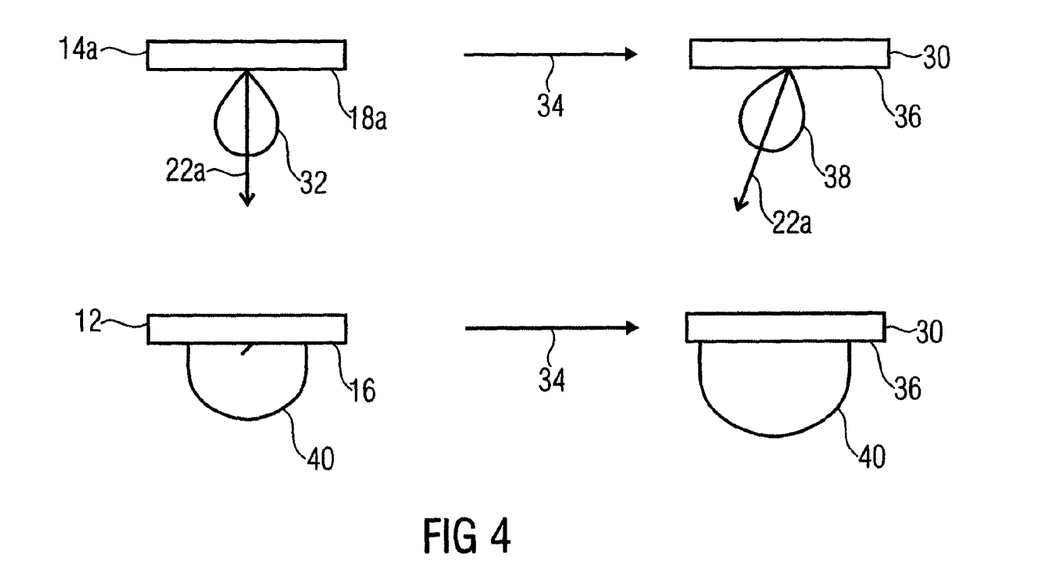
FIG. 4 is a schematic view for illustrating the effect of the optical layer of FIG. 3 according to an embodiment.

For example, FIG. 4 exemplarily shows that the LED comprises a directed distribution of radiation 32 by illustrating the angle distribution of radiation for a light beam exiting the LED 14a and/or for a location at the light exit face 18a by means of a line 32 radially moving further away from the location with increasing radiation in the respective direction. As can be seen, the directed distribution of radiation 32 exemplarily is influenced by the optical property 34 of the layer 30 so that the light of the LED 14a at the light exit side 36 of the layer 30 leads to light exiting the layer 30 with another or a different solid angle distribution 38, namely one having a different solid angle centroid 22a' here, for example. According to another embodiment of the layer 30, the influence 34 by the layer 30 may additionally or alternatively also have an effect on the solid angle expansion, i.e. lead to a difference in expansion between the original distribution of radiation 32 and the distribution 34, as would be the case in a diffuser layer, for example.

FIG. 4 exemplarily also shows how the optical property 34 of the layer 30 influences the solid angle distribution 40 of the radiated light of the OLED 12, wherein in the case of FIG. 4, it is exemplarily assumed that the layer 30 is formed such that the light leaving the layer on the side 36 and resulting from the light of the OLED 12 still has the same or almost the same radiation characteristics as originally at the light exit face 16 of the OLED 12, namely a more diffuse distribution 40 here than the distribution 32 of the LED 14a, for example.

The optical layer 30 may, for example, be a light-conducting layer diverting the light of the LED(s) 14a and/or 14b in a certain direction, which may be the same or also different, of course, for the different LEDs in the case of several LED(s) 14a and 14b, as it is illustrated in FIG. 3.

Figure 5:
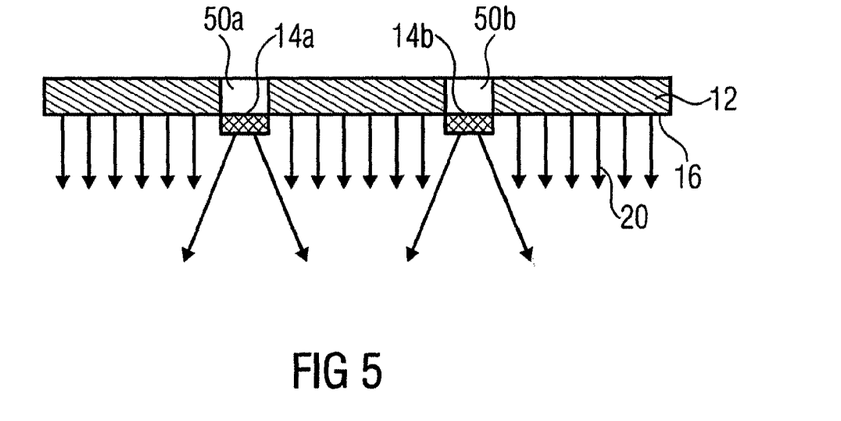
FIG. 5 is a sectional view of an illumination apparatus according to a still further embodiment.

In the case of FIG. 1, the LEDs 14a and 14b were arranged behind the OLED 12 with respect to the direction of radiation 20. In the embodiment of FIG. 5, an alternative hereto is shown. In this embodiment, the LEDs 14a and 14b are arranged in front of the OLED 12 in the direction of radiation 20. As illustrated in FIG. 5, the OLED 12 could be formed so that, at the locations in front of which the OLEDs 14a and 14b are formed, it has portions 50a and 50b at which the OLED 12 does not radiate, i.e. at which the light exit face 16 is interrupted. However, a laterally completely light-emitting OLED 12 with for example a simple contiguous light exit face 16 would also be possible. Like in the embodiment of FIG. 1, the LEDs 14a and 14b may be mounted, or held otherwise, at the side of the OLED 12 forming the light exit face 16 so as to be arranged in a stationary relation to the OLED.

For the sake of completeness only, it is to be pointed out that the number of inorganic LEDs neither is limited to two, as shown in the figures, nor to one, as stated previously as a possibility, nor to any other number, in the embodiments of FIGS. 1-5. Any number is possible. The lateral distribution in the case of several LEDs 14a, 14b across the light exit face 16 of the OLED 12 may be regular or irregular.

Figures 6A, 6B:
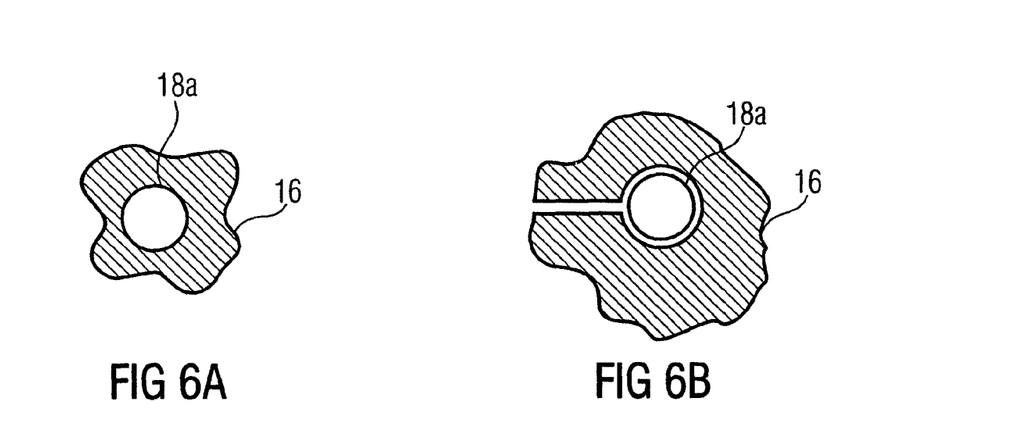
FIGS. 6a-c are projections of the light exit faces of an LED and an OLED along the direction of radiation according to various embodiment.
Figure 6C:
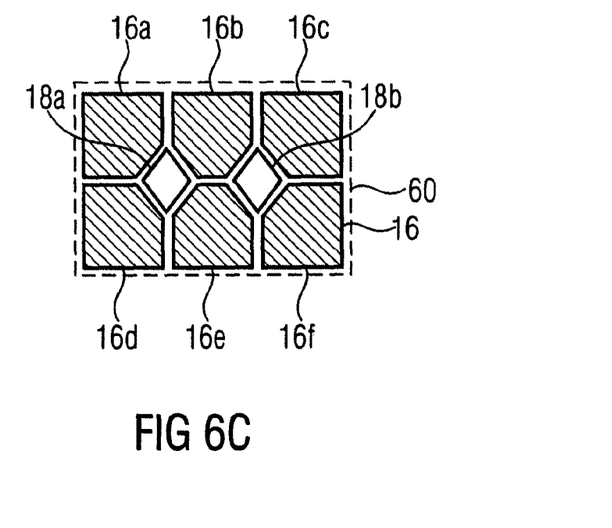

FIG. 6a shows an exemplary projection of the light exit face of the OLED 12 and an LED 14a along the direction of radiation 20, 22a and/or 22b, wherein it can be seen that the exit face 18a is laterally embedded in the light exit face 16. Here, in the case of FIG. 6a, the area of the light exit face 16 around the light exit face 18a forms a double contiguous area. In other words, in the embodiment of FIG. 6a, the light exit face 18a is laterally completely surrounded by the light exit face 16. This does not have to be the case, as shown in FIG. 6b. There, the area of the light exit face 16 around the light exit face 18a forms a single contiguous area. As shown in FIG. 6c, it is also possible here that the light exit face 16 of the OLED 12 itself does not define a contiguous area. In the case of FIG. 6c, for example, the light exit face 16 exemplarily forms a substantially rectangular area region 60 sub-divided into six parts 16a-16f in the gaps of which the light exit faces 18a and 18b of the LEDs 14a and 14b, respectively, are arranged therebetween. In this case, the embedding of the light exit faces 18a and 18b into the light exit face 16 has the effect that the light exit faces 18a and 18b are arranged completely within the smallest single contiguous and convex area into which the individual parts 16a-16f of the light exit face 16 can be inscribed completely, which smallest single contiguous convex area in the present case corresponds to the rectangle 60.

Preferably, an area ratio between a sum of the light exit faces 18a and 18b, i.e. $F_{18}=F_{18a}+F_{18b}$, on the one hand, and an overall area $F_{16}$ of the light exit face 16, on the other hand, is smaller than ½, i.e. $F_{18}/F_{16}<0.5$.

Although FIGS. 6a-6c show that the light exit face(s) 18 is (are) inside the light exit face 16, a sufficiently planar light output, in which the light of the LED 14 and the light of the LED 12 superimpose each other, is achieved even if the light exit face or the light exit faces 18 are at the edge of the light exit face 16 or the portions of the light exit face 16, namely if the area ratio between the smallest single contiguous convex area $F_{GES}$, which includes both light exit faces, i.e. 16 and 18, to the smallest single contiguous convex area $F_{16}$, which only includes the light exit faces 16, is smaller than 1.2, i.e. $F_{GES}/F_{16}<1.2$, wherein the overall area additionally or alternatively may satisfy the ratio $F_{GES}/F_{16}>1.02$.

The light exit faces 16a-16f may again be individually controllable parts of the OLED 12, in which case each part 16a-16f would correspond to an OLED, or the parts 16a-16f are only commonly controllable elements. In the first-mentioned case, the areas 16a-16f are defined via one of the two electrodes of the OLED, for example, i.e. via the anode or the cathode, structured correspondingly laterally in the individual parts 16a-16f, whereas the other electrode may be laterally continuous so as to extend across the entire area 60. In this case, it is also possible for the OLED 16 to display a display of a laterally shaped symbol or to serve as a pixel display for displaying variable content.

Besides, it is pointed out that the fact that the color spectrum of the LED may be the same as that of the OLED or that the same may be different, applies for all previous as well as for the other embodiments.

Figure 7:
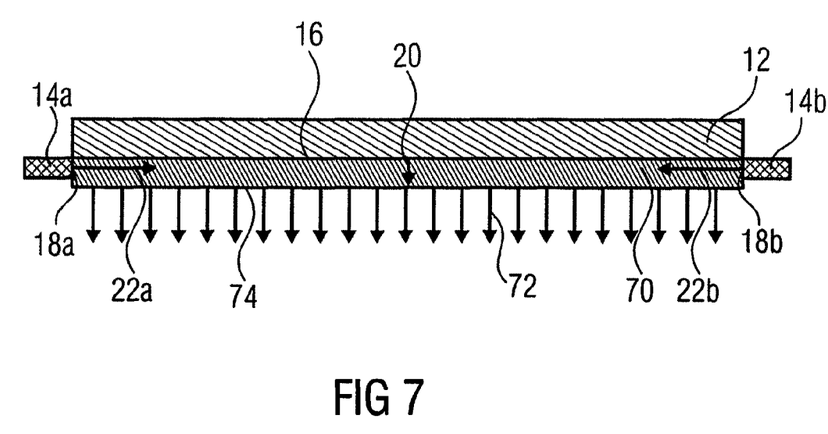
FIG. 7 is a sectional view of an illumination apparatus according to a further embodiment.
Figure 8:
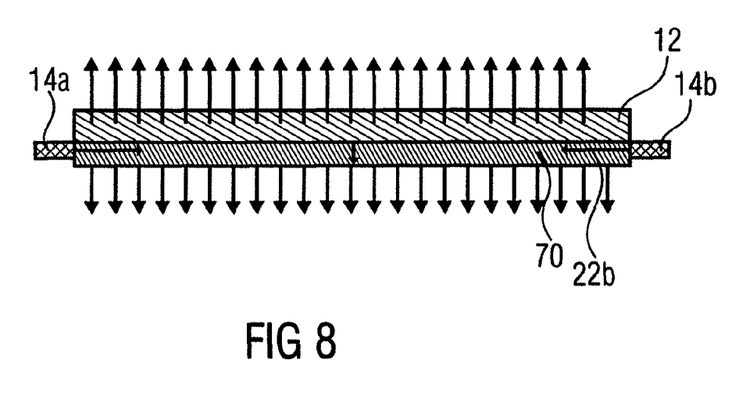
FIG. 8 is a sectional view of an illumination apparatus according to a further embodiment.

With reference to FIGS. 7 and 8, two embodiments will now described, wherein the superimposition of the LED light on the OLED light is effected differently, namely by way of the direction of radiation of the LEDs being lateral with respect to the direction of radiation of the OLED, with an optical layer diverting the laterally-launched light of the LEDs in the direction of radiation of the OLED. Hereby, color mixing of the light of the LED with the light of the OLED is possible, and a monochromatic or white OLED may be mixed in color by a laterally launched LED.

At first, FIG. 7 shows an embodiment of an illumination apparatus 10, wherein an optical layer 70 is formed behind the OLED 12 in a direction of radiation, such as on the side of the OLED 12 forming the light exit face 16 of the OLED 12, wherein one or, as exemplarily shown in FIG. 7, more inorganic LEDs 14a and 14b with respective light exit faces 18a and 18b are arranged so as to laterally launch light into the layer 70, for which purpose the direction of radiation 22a and 22b thereof is transversal to the direction of radiation 20 of the OLED 12, for example. In the case of FIG. 7, the LEDs 14a and 14b are arranged along the outer circumference of the layer 70.

The optical layer 70 is formed so that both the light of the OLED 12 and the light of the LEDs 14a and 14b leads to a light exit 72 on a side 74 of the optical layer 70 facing away from the OLED 12. The optical layer is a scatter layer, for example, i.e. a layer of transparent basic material in which scatter centers are established, the density of which for example increases in a lateral direction from the outside to the inside or from the LEDs 14a and 14b to the inside, so that the proportion of the LED light in the light output 72 is laterally uniform across the light exit face 16.

Optical layers 70 other than scatter layers may also be used, of course. For example, fluorescent or phosphorescent layers would be suited, in which case the light of the light exit 72 would indeed result from the light of the OLED 12 and the light of the LED 14a and 14b, but could at least partially consist of secondary light having another spectrum than the primary light of the OLED 12 and the LED 14a and 14b.

Furthermore, the layer 70 could be formed as a wedge layer, to achieve the lateral diversion of the light of the LEDs 14a and 14b.

FIG. 8 shows an embodiment in which, in contrast to the embodiment of FIG. 7, the OLED 12 is formed to radiate light on both sides, i.e. in the direction of the optical layer 70 and opposite thereto, wherein again the optical layer 70 may also be formed to divert the LED light of the LEDs 14a and 14b in both directions, i.e. through the side 74 as well as in the direction facing the OLED 12. In the embodiment of FIG. 8, hence, both the OLED and the LED light may exit on both sides. The OLED for example is formed to be transparent for the light resulting from the light of the LEDs 14a and 14b in the layer 70.

Figure 9:
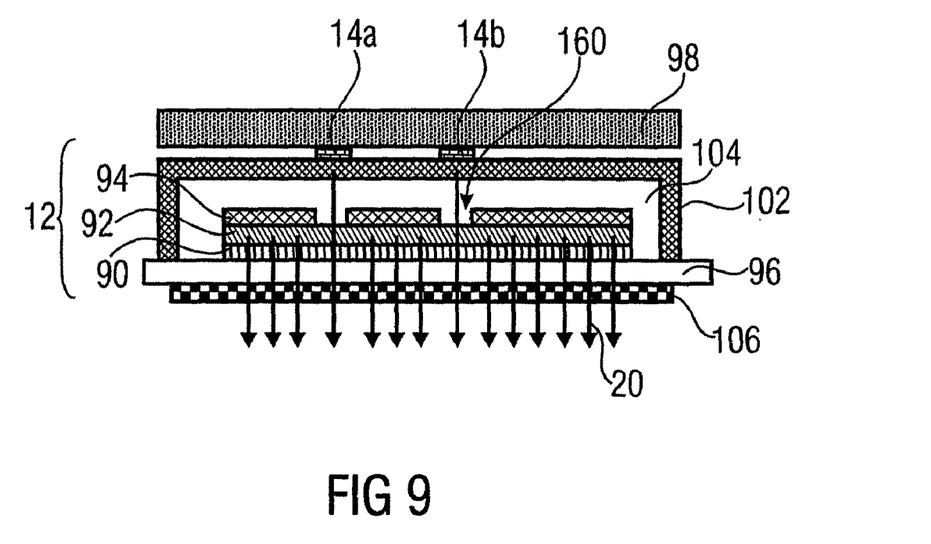
FIG. 9 is a sectional view of a possibility of realizing an illumination apparatus according to an embodiment.
Figure 10:
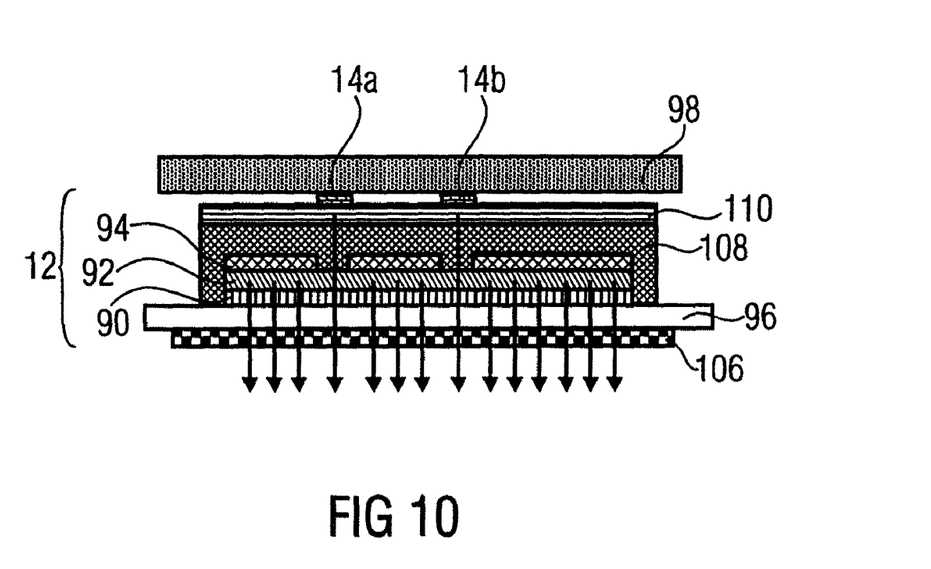
FIG. 10 is a sectional view of a further possibility for realizing an illumination apparatus.

With reference to FIGS. 9 and 10, detailed possibilities for realizing the embodiments according to FIGS. 1 to 3 will be described in the following, wherein the inorganic LEDs are behind the OLED. In addition, a possibility for manufacturing the same will be described.

According to FIG. 9, the OLED 12 includes a first electrode layer 90, a layer structure 92 with one or more organic layers, and a second electrode layer 94, which are disposed on a transparent carrier substrate 96 in this order. The LEDs 14a and 14b are arranged on a suitable substrate 98, such as a circuit board. The electrode layer and the layer structure 92 are transparent for the light of the LEDs 14a and 14b and may be formed continuously, as shown in FIG. 9. The second electrode layer 94 is structured so as to have openings 100 provided to transmit light of the LEDs 14a and 14b in the direction of radiation 20 of the OLED 12. In particular, a transparent lid 102 protects the sensitive OLED 12 from the outside by forming, together with the substrate 96, an enclosed cavity 104 in which the OLED 12 resides. Through this transparent lid 102, the LEDs 14a and 14b radiate in the same direction as the direction of radiation 20 of the OLED 12, for which purpose the circuit board 96 is disposed parallel to the substrate 96, namely so that the LEDs 14a and 14b face the OLED 12. As shown in FIG. 9, on the side of the substrate 96 facing away from the OLED 12, as described previously, an optical layer may optionally be arranged, such as a couple-out diffuser layer, i.e. a layer widening the solid angle distribution of the incident light. The layer is designated with 106 in FIG. 9.

In the production, at first, a transparent conductive material, such as indium tin oxide (ITO) or ZnO:Al, for example, is deposited on the transparent carrier material of the substrate 96, which is glass or foil, for example, in order to form the first electrode layer 90, wherein the layer 90 may still be structured to define the outer circumference. Then, for example, organic layers are deposited on this material to form the layer structure 92. For example, conductive material again is applied on this layer structure 92 and structured to form the second electrode layer 94, i.e. a conducting lid electrode 94, which may be transparent or non-transparent. In the non-transparent case, the electrode 94 may for example consist of metal, such as aluminum or silver, and in the transparent case, it may for example consist of a transparent conductor, such as a thin metal layer or a transparent oxide, such as ITO or ZnO. The lid 102 is formed of glass or foil or another transparent material, for example, to protect the OLED 12 from oxygen and water. The LEDs 14a and 14b, for example including suitable launch optics, are applied on the carrier 98, such as a circuit board, and attached to be positioned with respect to the OLED 12 so that the LEDs 14a and 14b emit light through the transparent parts 100 of the OLED 12, namely where the lid electrode 94 is removed or missing because of the structuring. The optical layer 106 may be applied to improve the homogeneity of the light exiting on the side of the substrate 96 facing away from the OLED 12.

FIG. 10 shows an embodiment differing from that of FIG. 9 in that the OLED 12 is not protected by a transparent lid, but by a thin-layer encapsulation 108, which also consists of a transparent material, such as epoxy resin, on which again a mechanical protection 110 in the form of e.g. glass or foil is arranged, in order to protect from mechanical influences from the side facing away from the substrate 96.

Figure 11:
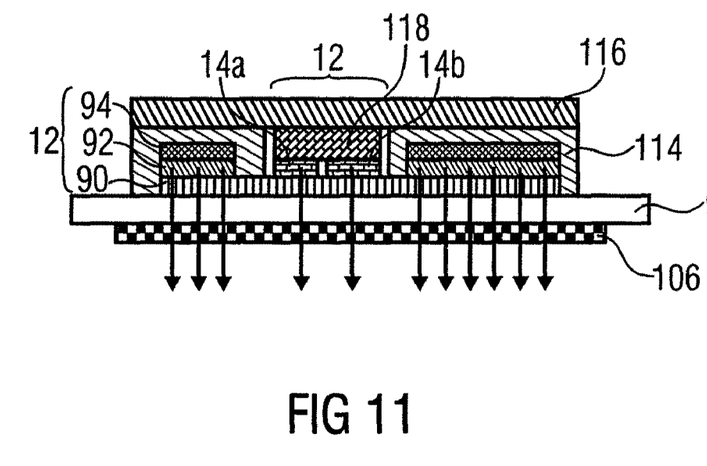
FIG. 11 is a sectional view of a further possibility of realizing an illumination apparatus.

FIG. 11 shows a further technical embodiment of an illumination apparatus corresponding to an embodiment for an illumination apparatus, according to which the OLED and the LEDs are arranged at the same height (when viewed in a direction of radiation). In this embodiment, both the OLED and the LEDs are arranged on the same substrate 96. In particular, the OLED 12 again includes the layers 90, 92 and 94, this time only the first electrode layer 90 being formed to be laterally continuous, whereas the organic layer structure 92 and the second electrode layer 94 are structured in a laterally matching way, to form one or more gaps 112. One or more LEDs 14a and 14b are arranged in this gap 112 on the side of the first electrode layer 90 facing away from the substrate 96. From the side facing away from the substrate 96, the layer structure 92 and the first electrode layer 94 are protected by a structured encapsulation 114, which is structured to leave the gap or gaps 112 free. On the side of the structured encapsulation 114 facing away from the substrate 96, there may be provided a termination plate 116 to which the LEDs 14a, 14b are mounted directly or, as illustrated in FIG. 11, via an intermediate carrier 118, so that in the case of suitable design of the intermediate carrier 118 or the plate 116 itself, the latter may serve as a heat sink for removing the heat developing in the LEDs.

For the production, for example, the organic layer structure 92 and the lid electrode 94 at first are encapsulated with the structured encapsulation 114, whereupon integration of the LEDs 14a and 14b by electrically contacting these devices with the first, transparent electrode 90 takes place, which may again be ITO or ZnO:Al, for example. The electrode 90 may here be reinforced by a metal layer in the non-viewing area, i.e. laterally wherever neither OLED nor LED light may be emitted through, for reducing the terminal resistance. For mounting, for example, a wire-bonding method or a flip-chip method may be used. Thereafter, the termination plate 116 may be attached on the backside, so as to serve for heat removal directly or via the intermediate carrier 150 particularly in the region of the LEDs 14a and 14b. FIG. 11 again illustrates that an optical layer 106 may be provided on the side of the substrate 96 facing away from the OLED 12.

With reference to the following figures, possible cases of application of the above-described embodiments will be described.

Figure 12:
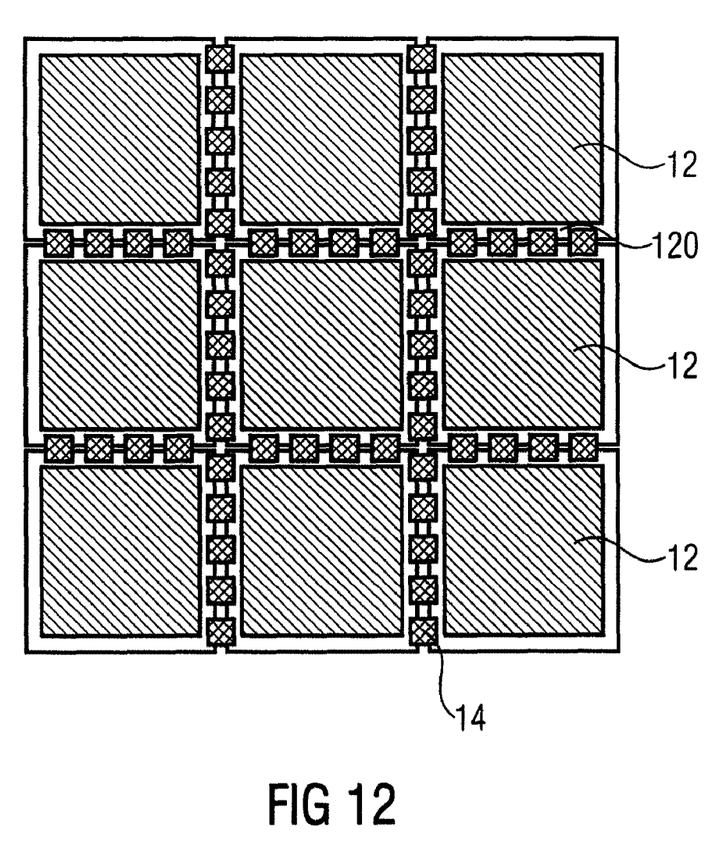
FIG. 12 is a top view onto an illumination apparatus according to an embodiment.

FIG. 12 exemplarily shows a combination among LEDs 14 and OLEDs 12, wherein the LEDs 14 are arranged in the non-luminous gap 120 of the OLEDs 12. On this occasion, it is to be pointed out that the arrangement of the LEDs and OLEDs is not limited to a rectangular arrangement both in the present embodiment and the previous embodiments. A non-rectangular arrangement of the OLEDs is also possible, for example in the case of FIG. 12, such as in the form of a character or writing. For example, the arrangement according to FIG. 12 could be used in the field of effect illumination or signal illumination. The LEDs 14 may, for example, be switched or controlled in a temporally flashing way and may be used for highlighting a contour of the character or the writing displayed by the OLEDs.

Figure 13:
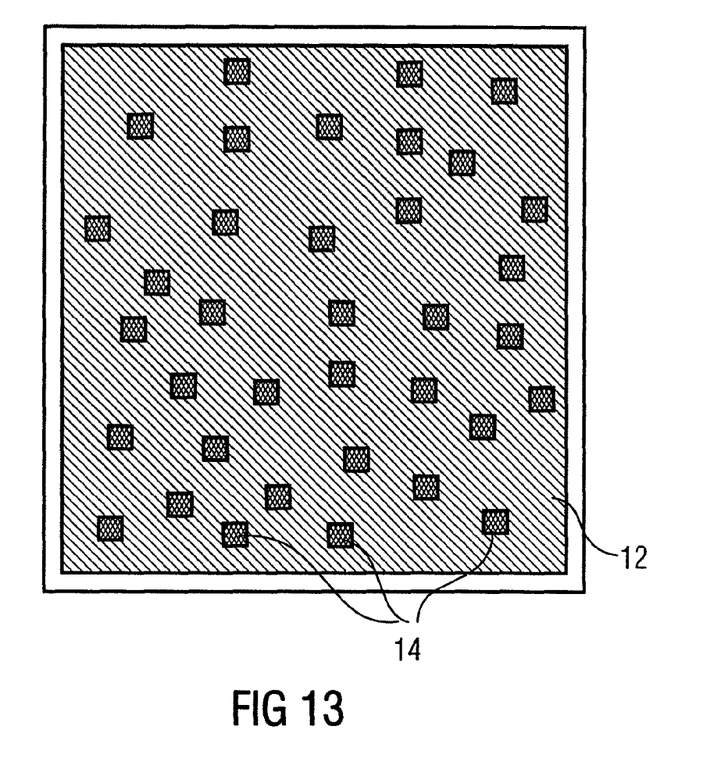
FIG. 13 is a top view onto an illumination apparatus according to a further embodiment.

FIG. 13 shows an arrangement of the LEDs 14 within the active light field or the light exit face of the OLEDs 100, wherein the effect illumination in this arrangement is integrated more in the actual viewing field. An irregular or quasi-random arrangement, as illustrated in FIG. 13, is suitable for effect illumination, in particular, such as in the form of a starry sky.

Figure 14:
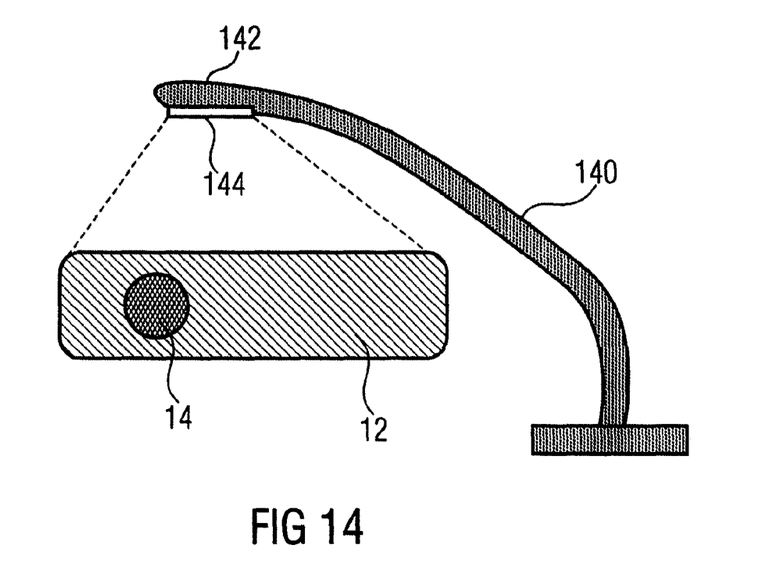
FIG. 14 is a side view of a lamp with an integrated illumination apparatus, the top view of which also is to be seen, according to an embodiment.

FIG. 14 shows an illumination element or lamp 140 in the light head 142 of which there is an illumination apparatus 144 with a combination of an OLED 12 and an LED 14 included. For example, the LED 14, in combination with couple-out optics (not shown), for example, takes over the function of point-shaped or more local illumination, such as for reading, wherein the OLED 12 serves as ambient illumination of the scenery.

Figure 15:
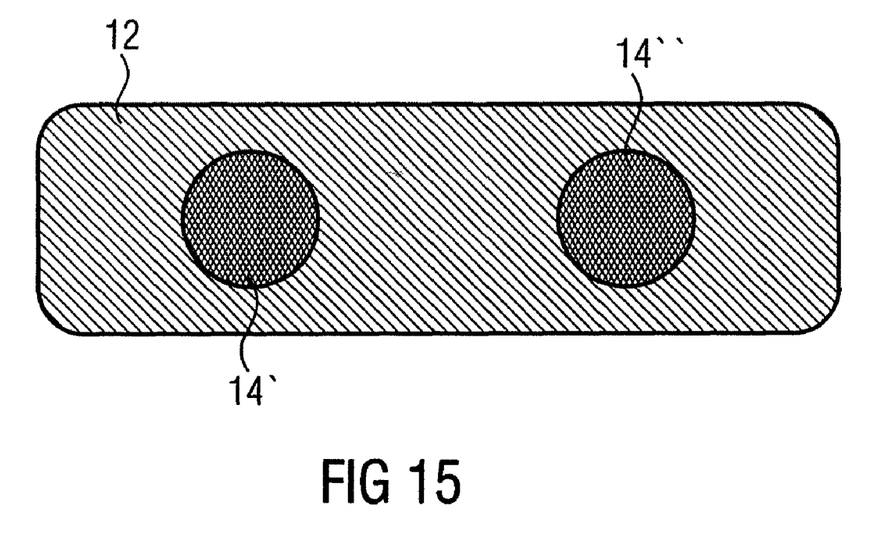
FIG. 15 is a top view onto an illumination apparatus integrated into a lamp according to a further embodiment.

A modification of the embodiment of FIG. 14 is shown in FIG. 15. In particular, in the case of FIG. 15, more than only one LED area 14 integrated in the OLED 12 is provided. Both LED areas 14' and 14' may be focused optically in different directions. Hereby, it is possible to illuminate certain seats in the interior illumination in automobiles or busses in a targeted manner, or to form rear lights with integrated brake lights or lamp combinations in airplanes.

In the previous description, in the case of the inorganic light-emitting device, an LED and not an inorganic LED in contrast to an OLED was mentioned only for the sake of simplicity. An inorganic LED may be a semiconductor LED, in particular, such as a light-emitting semiconductor diode in III-V semiconductor technology. With respect to the transparent area in the case of FIG. 1, it is pointed out that the same may, for example, also be formed by an opening in the OLED, or by a corresponding opening not only in one of the electrodes, but also an opening in the organic layer stack, as also described with respect to FIG. 11, for example.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An illumination apparatus with an inorganic light-emitting device with a first light exit area and an organic light-emitting device with a second light exit area larger than the first light exit area, wherein the inorganic light-emitting device and the organic light-emitting device are arranged so that a planar light output in which light of the inorganic light-emitting device and light of the organic light-emitting device superimpose each other results,
   wherein the inorganic light-emitting device and the organic light-emitting device radiate equally colored light, and the organic light-emitting device is formed as a planar luminaire and comprises a transparent portion, and the inorganic light-emitting device is mounted to the organic light-emitting device so as to radiate its light through the transparent portion so that the inorganic light-emitting device and the organic light-emitting device radiate their light in the same direction of radiation perpendicular to a planar extension of the organic light-emitting device, and the first light exit area is embedded in the second light exit area in a projection along the direction of radiation.

2. The illumination apparatus according to claim 1, wherein the organic light-emitting device is formed to be transparent for the light of the inorganic light-emitting device, and the inorganic light-emitting device is arranged in front of the organic light-emitting device in the direction of radiation.

3. The illumination apparatus according to claim 1, wherein the transparent portion is formed by an opening in a non-transparent backside electrode of the organic light-emitting device.

4. The illumination apparatus according to claim 1, wherein an optical layer is, in a direction of radiation of the organic light-emitting device, arranged downstream the organic light-emitting device, and the inorganic light-emitting device is arranged to radiate its light laterally into the optical layer, wherein the optical layer is formed so that both the light of the organic light-emitting device and the light of the inorganic light-emitting device lead to a light exit on a side of the optical layer facing away from the organic light-emitting device.

5. The illumination apparatus according to claim 4, wherein the organic light-emitting device is formed so that the same radiates its light also in a direction opposite to the direction of radiation, and the optical layer is formed so that the light of the inorganic light-emitting device also leads to a light exit on a side of the optical layer facing the organic light-emitting device.

6. The illumination apparatus according to claim 1, wherein several inorganic light-emitting devices are provided.

7. The illumination apparatus according to claim 6, wherein the inorganic light-emitting devices are arranged in a two-dimensionally regular arrangement laterally distributed across the second light exit area.

8. The illumination apparatus according to claim 1, wherein the inorganic light-emitting device is a semiconductor LED.

9. The illumination apparatus according to claim 1, wherein the organic light-emitting device is an OLED.

10. The illumination apparatus according to claim 1, wherein an optical layer influencing a solid angle distribution of radiation of the light of the organic light-emitting device less than a solid angle distribution of radiation of the light of the inorganic light-emitting device is, in the direction of radiation, arranged downstream the organic light-emitting device and the inorganic light-emitting device so that the light of the organic light-emitting device forms a diffuse illumination and the light of the inorganic light-emitting device is targeted light which is angled relative to the direction of radiation.

11. The illumination apparatus according to claim 10, wherein the optical layer is a diffuser layer, a transparent layer with local openings at a location of the inorganic light-emitting device, or a transparent layer with laterally varying surface relief structure.

12. A reading lamp with an illumination apparatus with an inorganic light-emitting device with a first light exit area and an organic light-emitting device with a second light exit area larger than the first light exit area, wherein the inorganic light-emitting device and the organic light-emitting device are arranged so that a planar light output in which light of the inorganic light-emitting device and light of the organic light-emitting device superimpose each other results, wherein the inorganic light-emitting device and the organic light-emitting device radiate equally colored light, and the organic light-emitting device is formed as a planar luminaire and comprises a transparent portion, and the inorganic light-emitting device is mounted to the organic light-emitting device so as to radiate its light through the transparent portion so that the inorganic light-emitting device and the organic light-emitting device radiate their light in the same direction of radiation perpendicular to a planar extension of the organic light-emitting device, and the first light exit area is embedded in the second light exit area in a projection along the direction of radiation, and wherein an optical layer influencing a solid angle distribution of radiation of the light of the organic light-emitting device less than a solid angle distribution of radiation of the light of the inorganic light-emitting device is, in the direction of radiation, arranged downstream the organic light-emitting device and the inorganic light-emitting device so that the light of the organic light-emitting device forms diffuse illumination and the light of the inorganic light-emitting device is targeted reading light angled relative to the direction of radiation.

13. An automobile tail lamp with an illumination apparatus with an inorganic light-emitting device with a first light exit area and an organic light-emitting device with a second light exit area larger than the first light exit area, wherein the inorganic light-emitting device and the organic light-emitting device are arranged so that a planar light output in which light of the inorganic light-emitting device and light of the organic light-emitting device superimpose each other results, wherein the inorganic light-emitting device and the organic light-emitting device radiate equally colored light, and the organic light-emitting device is formed as a planar luminaire and comprises a transparent portion, and the inorganic light-emitting device is mounted to the organic light-emitting device so as to radiate its light through the transparent portion so that the inorganic light-emitting device and the organic light-emitting device radiate their light in the same direction of radiation perpendicular to a planar extension of the organic light-emitting device, and the first light exit area is embedded in the second light exit area in a projection along the direction of radiation, and wherein an optical layer influencing a solid angle distribution of radiation of the light of the organic light-emitting device less than a solid angle distribution of radiation of the light of the inorganic light-emitting device is, in the direction of radiation, arranged downstream the organic light-emitting device and the inorganic light-emitting device so that the light of the organic light-emitting device forms a diffuse illumination and the light of the inorganic light-emitting device is targeted light which is angled relative to the direction of radiation, wherein the inorganic light-emitting device functions as a brake light and/or indicator.

14. A method of producing a planar light output by generating light by an inorganic light-emitting device with a first light exit area and generating light by an organic light-emitting device with a second light exit area larger than the first light exit area, so that the light of the inorganic light-emitting device and the light of the organic light-emitting device superimpose each other in the resultant planar light output, wherein the inorganic light-emitting device and the organic light-emitting device radiate equally colored light, and the organic light-emitting device is formed as a planar luminaire and comprises a transparent portion, and the inorganic light-emitting device is mounted to the organic light-emitting device so as to radiate its light through the transparent portion so that the inorganic light-emitting device and the organic light-emitting device radiate their light in the same direction of radiation, and the first light exit area is embedded in the second light exit area in a projection along the direction of radiation perpendicular to a planar extension of the organic light-emitting device.

15. Method according to claim 14, wherein an optical layer influencing a solid angle distribution of radiation of the light of the organic light-emitting device less than a solid angle distribution of radiation of the light of the inorganic light-emitting device is, in the direction of radiation, arranged downstream the organic light-emitting device and the inorganic light-emitting device, so that the light of the organic light-emitting device forms a diffuse illumination and the light of the inorganic light-emitting device is targeted light which is angled relative to the direction of radiation.

* * * * *